United States Patent
Song et al.

(10) Patent No.: US 9,828,669 B2
(45) Date of Patent: Nov. 28, 2017

(54) MICROWAVE RAPID THERMAL PROCESSING OF ELECTROCHEMICAL DEVICES

(71) Applicant: Applied Materials, Inc., Santa Clara, CA (US)

(72) Inventors: Daoying Song, Cupertino, CA (US); Chong Jiang, Cupertino, CA (US); Byung-Sung Leo Kwak, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 36 days.

(21) Appl. No.: 14/853,551

(22) Filed: Sep. 14, 2015

(65) Prior Publication Data

US 2016/0002771 A1 Jan. 7, 2016

Related U.S. Application Data

(63) Continuation of application No. 13/533,927, filed on Jun. 26, 2012, now Pat. No. 9,136,569, which is a
(Continued)

(51) Int. Cl.
*C23C 14/58* (2006.01)
*C23C 16/56* (2006.01)
(Continued)

(52) U.S. Cl.
CPC .......... *C23C 14/5806* (2013.01); *C23C 14/08* (2013.01); *C23C 14/24* (2013.01);
(Continued)

(58) Field of Classification Search
CPC .......................... C23C 16/56; C23C 14/5806
See application file for complete search history.

(56) References Cited

U.S. PATENT DOCUMENTS

| 5,178,739 A | 1/1993 | Barnes et al. |
| 5,591,543 A | 1/1997 | Peled et al. |

(Continued)

FOREIGN PATENT DOCUMENTS

| CN | 101073171 | 11/2007 |
| JP | 2005-071680 | 3/2005 |

(Continued)

OTHER PUBLICATIONS

Hayashi, et al., "Preparation of Positive LiCo2 Films by Electron Cyclotron Resonance (ECR) Plasma Sputtering method and its Application to All Solid State Thin Film Lithium Batteries", J. of Power Sources, vol. 174, No. 2, Dec. 6, 2007, pp. 990-995.

(Continued)

*Primary Examiner* — Jason Berman
(74) *Attorney, Agent, or Firm* — Pillsbury Winthrop Shaw Pittman LLP (57) ABSTRACT

Microwave radiation may be applied to electrochemical devices for rapid thermal processing (RTP) (including annealing, crystallizing, densifying, forming, etc.) of individual layers of the electrochemical devices, as well as device stacks, including bulk and thin film batteries and thin film electrochromic devices. A method of manufacturing an electrochemical device may comprise: depositing a layer of the electrochemical device over a substrate; and microwave annealing the layer, wherein the microwave annealing includes selecting annealing conditions with preferential microwave energy absorption in the layer. An apparatus for forming an electrochemical device may comprise: a first system to deposit an electrochemical device layer over a substrate; and a second system to microwave anneal the layer, wherein the second system is configured to provide preferential microwave energy absorption in the device layer.

24 Claims, 8 Drawing Sheets

Related U.S. Application Data continuation-in-part of application No. 12/124,918, filed on May 21, 2008, now Pat. No. 8,568,571.

(51) Int. Cl.

| | | |
|---|---|---|
| H01M 4/04 | (2006.01) | |
| H01M 4/1391 | (2010.01) | |
| H01M 4/525 | (2010.01) | |
| H01M 10/0585 | (2010.01) | |
| H01M 6/40 | (2006.01) | |
| H01M 10/0525 | (2010.01) | |
| H01M 14/00 | (2006.01) | |
| C23C 14/08 | (2006.01) | |
| C23C 14/24 | (2006.01) | |
| C23C 14/34 | (2006.01) | |
| G02F 1/155 | (2006.01) | |
| H01M 4/131 | (2010.01) | |

(52) U.S. Cl.
CPC .......... *C23C 14/34* (2013.01); *C23C 14/3485* (2013.01); *C23C 16/56* (2013.01); *G02F 1/155* (2013.01); *H01M 4/0404* (2013.01); *H01M 4/0423* (2013.01); *H01M 4/0426* (2013.01); *H01M 4/131* (2013.01); *H01M 4/1391* (2013.01); *H01M 4/525* (2013.01); *H01M 6/40* (2013.01); *H01M 10/0525* (2013.01); *H01M 10/0585* (2013.01); *H01M 14/005* (2013.01); *Y02E 60/122* (2013.01); *Y02P 70/54* (2015.11)

(56) References Cited

U.S. PATENT DOCUMENTS

| | | | |
|---|---|---|---|
| 5,995,271 A | 11/1999 | Zieba et al. | |
| 6,172,322 B1 | 1/2001 | Shang et al. | |
| 6,376,027 B1 | 4/2002 | Lee et al. | |
| 6,506,289 B2 | 1/2003 | Demaray et al. | |
| 6,699,456 B1* | 3/2004 | Krampitz | C01G 23/005 |
| | | | 423/594.15 |
| 6,921,464 B2 | 7/2005 | Krasnov et al. | |
| 7,928,021 B2 | 4/2011 | Kowalski et al. | |
| 2003/0138701 A1* | 7/2003 | Tsukiashi | H01M 2/162 |
| | | | 429/250 |
| 2003/0227663 A1* | 12/2003 | Agrawal | B32B 17/10036 |
| | | | 359/265 |
| 2004/0048157 A1 | 3/2004 | Neudecker et al. | |
| 2004/0064937 A1 | 4/2004 | Krasnov et al. | |
| 2006/0134522 A1 | 6/2006 | Zhang et al. | |
| 2006/0141138 A1 | 6/2006 | Hamrock et al. | |
| 2006/0257745 A1 | 11/2006 | Choi et al. | |
| 2007/0015058 A1 | 1/2007 | Takezawa et al. | |
| 2007/0175020 A1* | 8/2007 | Nagata | B32B 18/00 |
| | | | 29/623.3 |
| 2011/0048614 A1 | 3/2011 | Veerasamy | |
| 2011/0129594 A1 | 6/2011 | Kwak et al. | |
| 2011/0223359 A1 | 9/2011 | Yang et al. | |

FOREIGN PATENT DOCUMENTS

| | | |
|---|---|---|
| JP | 2005-139498 | 6/2005 |
| JP | 2005-141981 A | 6/2005 |
| JP | 2006-060064 | 6/2006 |
| JP | 2006-228733 | 8/2006 |
| JP | 2007-048744 | 2/2007 |
| JP | 2007-005219 | 4/2007 |
| JP | 2007-138268 | 6/2007 |
| JP | 2008-523567 | 7/2008 |
| JP | 2011-515824 | 5/2011 |
| JP | 2011-521433 A | 7/2011 |
| JP | 2012-022858 A | 2/2012 |
| WO | 2006/063308 | 6/2006 |
| WO | 2009/120515 | 10/2009 |
| WO | WO 2009/143254 A | 11/2009 |

OTHER PUBLICATIONS

Granqvist, CG, "Electrochromatic Materials: Out of a Niche", Nature Materials, vol. 5, No. 2, Feb. 2006, pp. 89-90.
Dudney, et al., "Solid State Thin Film Rechargeable Batteries", Materials Science and Engineering, B 116, 2005, pp. 245-249.

* cited by examiner

MICROWAVE RAPID THERMAL PROCESSING OF ELECTROCHEMICAL DEVICES

CROSS-REFERENCE TO RELATED APPLICATIONS

This application is a continuation of U.S. patent application Ser. No. 13/533,927 filed Jun. 26, 2012 (now U.S. Pat. No. 9,136,569), which is a continuation-in-part of U.S. application Ser. No. 12/124,918 filed May 21, 2008 (now U.S. Pat. No. 8,568,571), both applications are fully incorporated by reference herein.

FIELD

The present disclosure relates to microwave rapid thermal processing of electrochemical devices, and in particular, microwave annealing processes for certain layers of thin film batteries, electrochromic devices and Li-ion batteries.

BACKGROUND

All solid state Thin Film Batteries (TFB) are known to exhibit several advantages over conventional battery technology such as superior form factors, cycle life, power capability and safety. However, there is a need for cost effective and high-volume manufacturing (HVM) compatible fabrication technologies to enable broad market applicability of TFBs.

Most of the past and current state-of-the-art approaches, as they pertain to TFB and TFB fabrication technologies, have been conservative, wherein the efforts have been limited to scaling the basic technologies of the original Oak Ridge National Laboratory (ORNL) device development that started in the early 1990s. A summary of ORNL TFB development can be found in N. J. Dudney, Materials Science and Engineering B 116, (2005) 245-249.

FIGS. 1A to 1F illustrate a traditional process flow for fabricating a TFB on a substrate. In the figures, a top view is shown on the left and a corresponding cross-section A-A is shown on the right. There are also other variations, e.g., an "inverted" structure, wherein the anode side is grown first, which are not illustrated here. FIG. 2 shows a cross-sectional representation of a complete TFB, which may have been processed according to the process flow of FIGS. 1A to 1F.

Figure 1A:
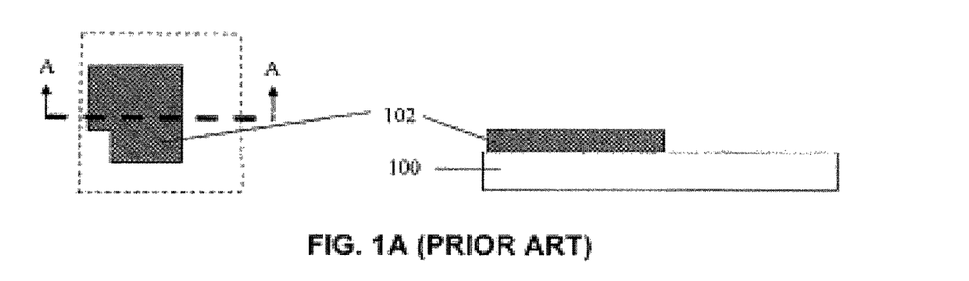
FIGS. 1A to 1F illustrate steps of a conventional process for forming TFBs.
Figure 1B:
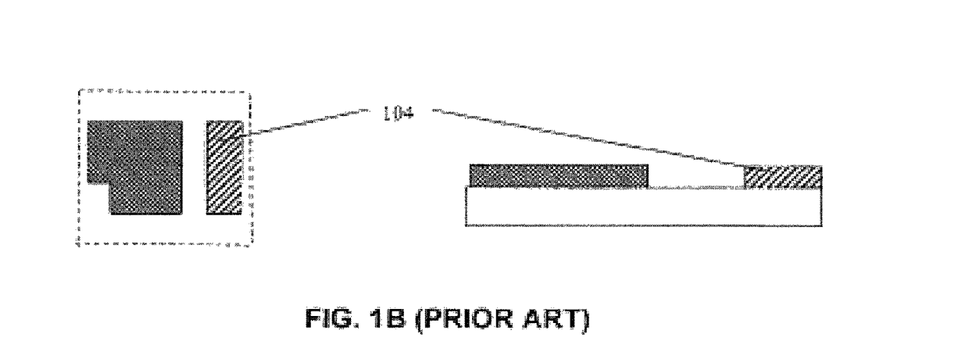
Figure 2:
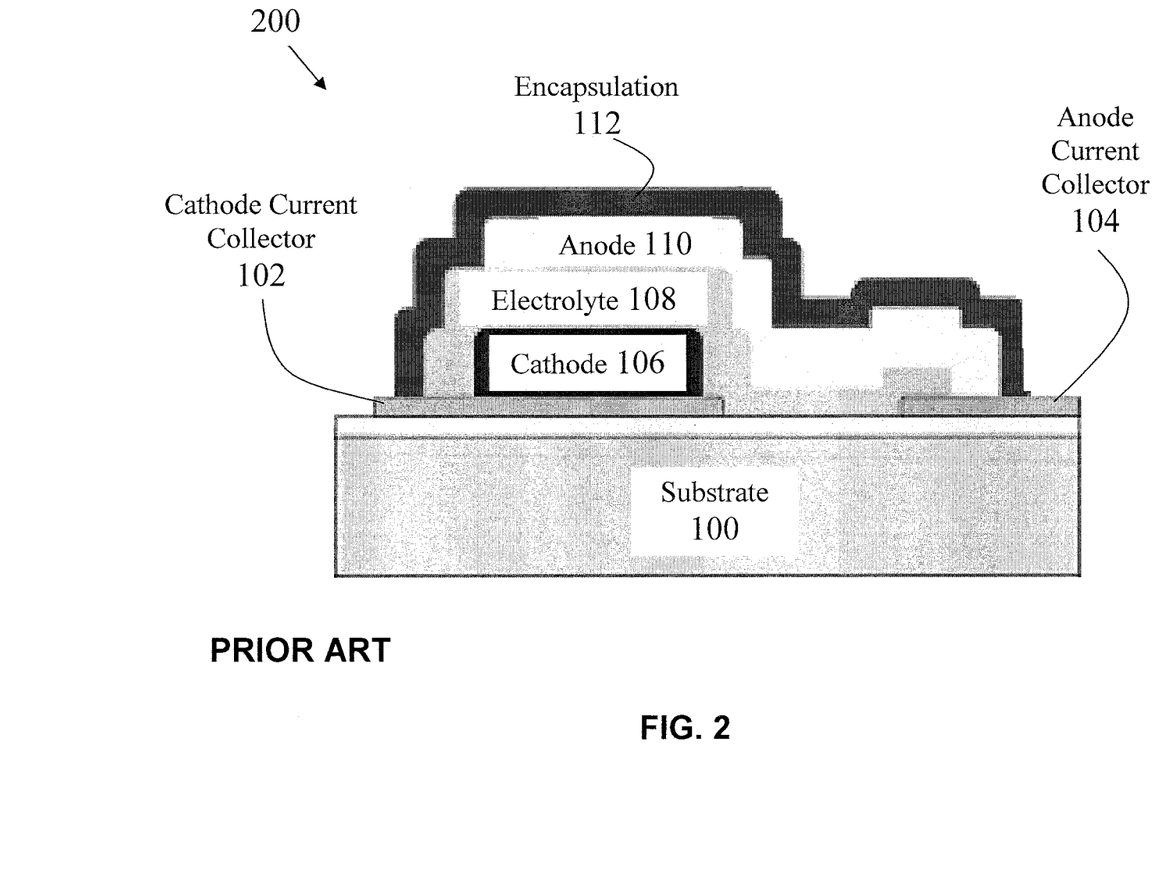
FIG. 2 is a cross-sectional representation of a first prior art thin film battery.
Figure 3:
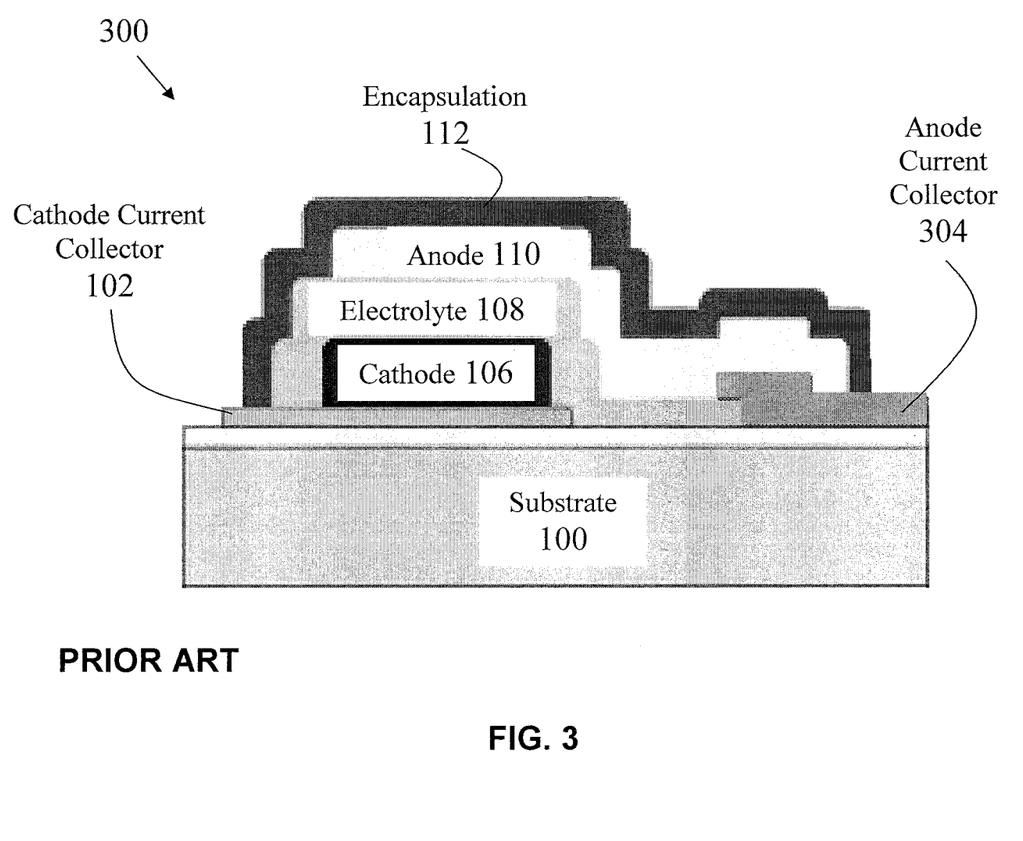
FIG. 3 is a cross-sectional representation of a second prior art thin film battery.

As shown in FIGS. 1A and 1B, processing begins by forming the cathode current collector (CCC) 102 and anode current collector (ACC) 104 on a substrate 100. This can be done by (pulsed) DC sputtering of metal targets (~300 nm) to form the layers (e.g. main group metals such as Cu, Ag, Pd, Pt and Au, metal alloys, metalloids or carbon black), followed by masking and patterning for each of the CCC and ACC structures. It should be noted that if a metallic substrate is used, then the first layer may be a "patterned dielectric" deposited after a blanket CCC 102 (the CCC may be needed to block Li in the cathode from reacting with the substrate). Furthermore, the CCC and ACC layers may be deposited separately. For example, the CCC may be deposited before the cathode and the ACC may be deposited after the electrolyte, as shown in FIG. 3. For current collector layers formed of metals such as Au and Pt that do not adhere well to, for example, oxide surfaces, adhesion layers of metals such as Ti and Cu can be used.

Figure 1C:
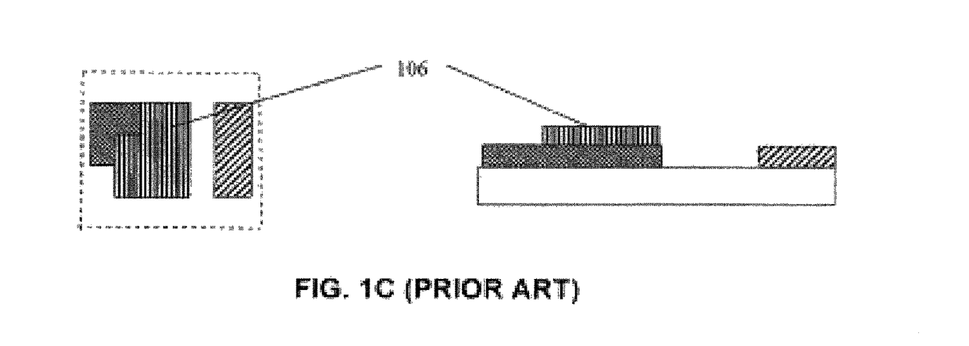
Figure 1D:
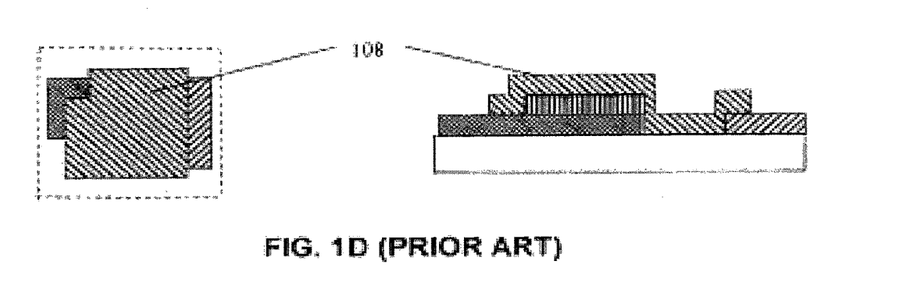

Next, in FIGS. 1C and 1D, the cathode 106 and electrolyte layers 108 are formed, respectively. RF sputtering has been the traditional method for depositing the cathode layer 106 (e.g. $LiCoO_2$) and electrolyte layer 108 (e.g. $Li_3PO_4$ in $N_2$). However, pulsed DC has been used for $LiCoO_2$ deposition. The cathode layer 106 can be a few to several or more microns thick, and the electrolyte layer 108 can be about 1 to 3 μm thick.

Figure 1E:
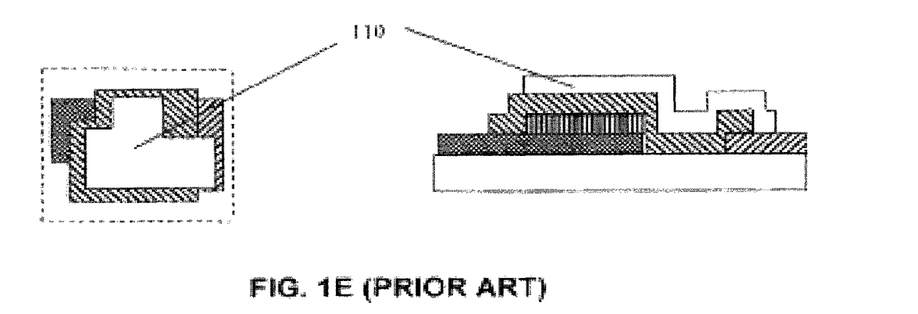
Figure 1F:
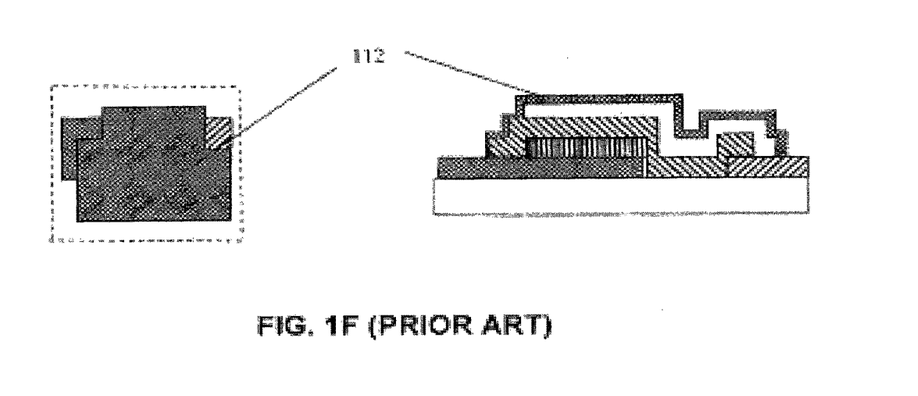

Finally, in FIGS. 1E and 1F, the Li layer 110 and protective coating (PC) layer 112 are formed, respectively. The Li layer 110 can be formed using an evaporation or a sputtering process. The Li layer 110 can be a few to several or more microns thick (or other thickness depending on the thickness of the cathode layer) and the PC layer 112 can be in the range of 3 to 5 μm, and more depending on the materials constituting the layer. The PC layer 112 can be a multilayer of parylene (or other polymer-based material), metal or dielectric. Note that, between formation of the Li layer and the PC layer, the part must be kept in an inert or reasonably inert environment, such as argon gas or dry-room conditions.

There may be an additional "barrier" layer deposition step, prior to the CCC 102, if the CCC does not function as the barrier and if the substrate and patterning/architecture call for such a barrier layer. Also, the protective coating need not be a vacuum deposition step.

In typical processes, annealing of the cathode layer 106 will be required in order to improve the crystallinity of the layer if the TFB performance specification calls for "plateau of operating voltage", high power capability and extended cycle life.

While some improvements have been made to the original ORNL approaches, there are many problems with the prior art fabrication processes for TFBs that prevent them from being compatible with cost effective and high-volume manufacturing (HVM), and thereby preclude broad market applicability of TFBs. For example, issues with the state-of-the-art thin film cathode and cathode deposition processes include: (1) a low deposition rate leading to low throughput and inefficient scaling (of economy) for cost reduction, and (2) a need for a high temperature anneal for the crystalline phase, which adds to process complexity, low throughput and limitations on the choice of substrate materials.

Accordingly, a need remains in the art for fabrication processes and technologies for TFBs that are compatible with cost effective and high-volume manufacturing (HVM), and thereby enable broad market applicability of TFBs.

SUMMARY

The present disclosure relates to methods and apparatuses that overcome key problems of current state-of-the-art fabrication technologies for electrochemical devices, such as thin film batteries (TFBs) and electrochromic (EC) devices, which preclude broad market applications. The disclosure relates to the application of microwave radiation for rapid thermal processing (RTP) (including annealing, crystallizing, densifying, forming, etc.) of individual layers of electrochemical devices, as well as device stacks, as needed, including bulk and thin film batteries and thin film electrochromic devices. Microwave RTP provides greater device fabrication process flexibility compared with a conventional furnace or lamp-based anneal. A method of manufacturing an electrochemical device according to certain aspects of the present disclosure may comprise: depositing a layer of the electrochemical device over a substrate; and microwave annealing the layer, wherein the microwave annealing includes selecting annealing conditions with preferential microwave energy absorption in the layer. An apparatus for forming an electrochemical device according to further aspects of the present disclosure may comprise: a first system to deposit an electrochemical device layer over a substrate; and a second system to microwave anneal the layer, wherein the second system is configured to provide preferential microwave energy absorption in the device layer.

In one embodiment, the disclosure provides new microwave annealing processes to facilitate thin film battery (TFB) fabrication by increasing the throughput, yield and performance, For example, a desirable property of a deposited TFB cathode layer is good crystallinity, and post deposition annealing using microwave radiation can achieve good layer crystallization while significantly reducing the time and side effects when compared to conventional furnace and lamp-based annealing. With microwave annealing, the TFB cathode layer can be fully crystallized without, or with less, film cracking and with less thermal damage to the CCC layers, which strongly improves TFB performance and reliability. Furthermore, the cathode layer may be made relatively thicker for increased capacity, when compared with what can be achieved using conventional furnace annealing. This is so because the gentler annealing process allows reduced propensity for stress cracking with thicker layers.

Herein the term annealing is used to refer to the process of heat treatment in which the microstructure and therefore the properties of a material are altered; annealing is to be understood to include the more specific processes of crystallizing, densifying and forming. The term formation is used herein to refer to the thermal processing of deposited electrochemical layers and devices so that the structure becomes open to lithium intercalation by forming the desired phase, crystallinity, microstructure and surface morphology.

BRIEF DESCRIPTION OF THE DRAWINGS

These and other aspects and features of the present disclosure will become apparent to those ordinarily skilled in the art upon review of the following description of specific embodiments of the disclosure in conjunction with the accompanying figures, wherein.

DETAILED DESCRIPTION

Embodiments of the present disclosure will now be described in detail with reference to the drawings, which are provided as illustrative examples of the disclosure so as to enable those skilled in the art to practice the disclosure. Notably, the figures and examples below are not meant to limit the scope of the present disclosure to a single embodiment, but other embodiments are possible by way of interchange of some or all of the described or illustrated elements. Moreover, where certain elements of the present disclosure can be partially or fully implemented using known components, only those portions of such known components that are necessary for an understanding of the present disclosure will be described, and detailed descriptions of other portions of such known components will be omitted so as not to obscure the disclosure. In the present specification, an embodiment showing a singular component should not be considered limiting; rather, the disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present disclosure encompasses present and future known equivalents to the known components referred to herein by way of illustration.

Often in electrochemical devices, the active materials (in their final form) need to have good crystallinity, as opposed to having an amorphous or even microcrystalline structure. A typical cathode material in batteries (thin film or bulk) is $LiCoO_2$, which is deposited as an amorphous or microcrystalline layer under typical conditions of physical vapor deposition. As such, the deposited layers need to be annealed, typically using a furnace, to crystallize the film. The furnace temperature has to ramp up to several hundred degrees to fully crystallize the film. This furnace anneal process takes several hours to complete as it goes through ramp up, soak, and cool down stages. While the throughput implications can be overcome with multiple furnaces, such an approach can lead to high cost of capital investment. In addition, the furnace anneal appears to deteriorate the interface between the cathode and cathode current collector and the properties (for example, the electrical conductivity) of the cathode current collector (and ACC, if ACC is created prior to this anneal), leading to battery cells with higher impedance for poorer power (discharge/charge rate) capability. Furthermore, furnace anneal processes cause cracking of the $LiCoO_2$ cathode film due to a mismatch of the thermal expansion coefficient between the cathode and the substrate, where typical substrate materials are Si/SiN, glass mica, metal foils, etc. Other radiation based rapid thermal annealing may be used. However, the breadth of wavelengths in typical broad spectrum lamps (a laser would be too expensive) means that the result of lamp annealing is very similar to that for the standard furnace anneal, including the undesirable side effects and throughput issues.

The use of microwave annealing of layers in electrochemical device stacks offers much higher throughput with its shorter process times, when compared with conventional furnace annealing processes. Microwave annealing provides a temperature profile during ramp up and down that is more flexible and with faster response, which should enable broader process windows and process adaptability for alleviation of a wide range of thermal stress induced adverse situations, such as cracking and phase transitions. For example, cathode current collectors, typically metal layers, will undergo reduced thermal damage during annealing of cathode layers since the metal layers strongly reflect the microwave energy, thus directly absorbing very little microwave energy—the cathode current collector is heated primarily by thermal conduction from microwave energy absorbed in the adjacent cathode layer. Furthermore, proper power ramping profiles and configurations also lead to good surface morphology for the cathode layer after annealing, such as being free of or having a lower density of cracking than is seen with conventional furnace annealing. Improved device performance, production capacity and device yield are expected with the use of the microwave annealing processes of the present disclosure. The reason for reduced adverse outcomes with microwave annealing of the cathode appears to be due to the selectivity of microwave energy absorption (where conditions can be selected with preferential microwave energy absorption in the cathode) leading to full annealing of the cathode layer, while the surrounding layers see a lower temperature. This is not the case for furnace and lamp-based RTP processes wherein all layers reach the same temperature. At a first glance, the temperature differential between the cathode and the CCC/substrate, in microwave heating, might be viewed as generating greater stress in the device being annealed. However, the stress in the device being annealed is volume dependent, i.e., the total stress is the sum of all stresses in the volume, and the stress due to the preferential heating of the cathode to the annealing temperature will actually be less than the stress due to heating the entire device to the same annealing temperature. Thus, the device exhibits greater stability during microwave annealing. In general, the present disclosure overcomes several of the key problems of current state-of-the-art thin film battery (TFB) technologies that preclude them from being compatible with cost-effective and high-volume manufacturing.

Selection of annealing conditions for an electrochemical device for which there is preferential energy absorption in a particular layer of the electrochemical device may include selecting operating conditions of the microwave annealing system, such as the microwave frequency or frequencies. Furthermore, the microwave absorption of one or more layers of an electrochemical device may be tuned by modifying the chemical composition and/or crystalline structure of the one or more layers during deposition of the one or more layers and/or post-deposition treatment. Such changes may modulate the electrical conductivity, where microwave absorption is a function of electrical conductivity, such that the microwave absorption is changed for one or more layers in the stack. Yet furthermore, additional layers—referred to herein as interlayers—may be added to the stack of an electrochemical device specifically for affecting energy flow and distribution within the electrochemical device during microwave annealing. For example, an interlayer may be added to the stack specifically for: reflecting or absorbing microwave radiation; and/or affecting thermal conduction within the stack, such that the interlayer may inhibit or enhance heat flow through adjacent layers of the stack. Suitable interlayer materials may include one or more of: materials with high electrical conductivity for reflecting microwave radiation; materials with low electrical conductivity for absorbing microwave radiation; materials with low thermal conductivity to inhibit flow of heat through the interlayer; materials with high thermal conductivity to improve flow of heat through and along the interlayer; and materials mismatched with surrounding materials such that the thermal transmittance across the interface between layers is poor due to mismatch of phonon modes.

A first example of modifying the chemical composition and/or crystalline structure of a layer is to increase the electrical resistance and thus the microwave absorption for an oxide, such as $LiCoO_2$ or ITO, by increasing the oxygen content. A second example is to increase the electrical conductivity and thus the microwave reflectivity of an oxide layer by doping with metals/metal oxides. For instance, in an electrochemical device stack comprising substrate/ITO/ $MNiO_y$/electrolyte/$WO_x$/ITO, the electrical conductivity of the ITO layer on the substrate may be increased so as to reflect microwaves back into the $MNiO_y$ layer and increase the heating of said layer. (Here "M" refers to any metal or metals doped into the nickel oxide; the doping may form a homogeneous phase, or result in grains with heterogeneous phases.) A first example of an interlayer is a microwave reflecting layer such as a thin layer of metal that is included in an electrochemical device stack—substrate/ITO/$WO_x$/ LiPON/$MNiO_y$/Li/ITO—between substrate and ITO or between ITO and $WO_x$ to protect the $WO_x$ and LiPON from microwave radiation coming through the substrate. A second example of an interlayer in said device stack, again between substrate and ITO or between ITO and $WO_x$, is a thin layer of thermoelectric material—these materials have high electrical conductivity (reflect microwaves) and low thermal conductivity (providing some level of thermal isolation of layers above the interlayer from layers below the interlayer); an example of a potentially suitable thermoelectric interlayer material is the metal alloy $Bi_2Te_3$. Metallic interlayer materials used in an electrochromic stack will need to be optically transparent in the visible spectrum, and consequently will typically be less than 100 nm thick. However, for TFB stacks, where transparency is not an issue, the interlayers may be thicker—for example, of sufficient thickness to ensure the interlayer reflects greater than a certain predetermined percentage of the incident microwave radiation during annealing.

As described above, microwave annealing according to some embodiments can be used for cathode materials such as $LiCoO_2$. The fewer side effects and higher throughput of the microwave anneal compared with the conventional furnace anneal and lamp-based RTP allows for a wider range of $LiCoO_2$ deposition conditions—specifically higher deposition rate processes and/or simpler deposition tools may be used than for a process flow using a furnace anneal or lamp-based RTP. These higher deposition rate processes typically result in poorer film crystallinity; however, microwave anneal, which can fully crystallize the film with less thermal side effects and provide an overall higher throughput, can accommodate greater thermal load on the as-deposited "poorer quality" cathode layers in order to attain the desired film characteristics, and thereby, allow a larger process window for the $LiCoO_2$ deposition process. In addition, the gentler process will expand the layer thickness limit with reduced propensity for adverse film morphology effects, like crack formation.

The principles and teaching of the present disclosure may also be applied to other thin film (vacuum deposited) electrochemical devices such as electrochromic devices, and to thick film (non-vacuum deposited) processing, such as for Li-ion batteries, including the drying and formation of Li-ion cathodes and intercalation anodes, deposited as a slurry, using microwave heating. Furthermore, microwave heating may also be used for bulk processing in Li-ion batteries for grain growth or agglomeration of electrode materials to control surface area and tapping density, where a microstructure is desired which is controlled at two different scales —larger grains that are an agglomeration of smaller grains. Li-ion cathodes and intercalation anodes that may be suitable for microwave processing as described above include: layered cathode materials (e.g., nickel cobalt aluminum oxide (NCA) and nickel cobalt manganese oxides (NCM)), spinel-based oxides (e.g. Lithium Manganese Oxide), and olivine based phosphates such as lithium iron phosphate (LFP) for the cathode; and lithium titanate for the anode.

Some embodiments utilize a system (reactor chamber and power inputs) that can produce highly uniform microwave power distribution within a reactor/chamber. In addition, the internal configuration of the microwave chamber may be optimized to manage the thermal energy propagation (generated by microwave absorbing material and surroundings) such that the heat loss is minimized to assure uniform heating and propagation within the layer/structure of interest. Examples of microwave processing chambers that may be used for some embodiments are provided in U.S. Pat. No, 7,928,021 and at www.dsgtek.com, last visited Apr. 3, 2012. These chambers are equipped with multiple (up to ten, for example) microwave sources (such as magnetrons) and configured to provide uniform microwave irradiation of substrates. The uniformity of microwave heating and the substrate temperature may be further controlled by the susceptor or susceptors (susceptors may be placed on both sides of a substrate) and also a chill plate attached to one of the susceptors, if needed. Furthermore, since the microwave frequency may be tuned for preferred absorption in the desired material(s), energy may be targeted where needed and heating of other layers in the device stack may be less than for a comparable furnace anneal process. See U.S. Pat. No. 7,928,021, incorporated by reference in its entirety herein.

A microwave annealing chamber such as described in U.S. Pat. No. 7,928,021 was used to anneal a one micron thick layer of $LiCoO_2$ TFB cathode material deposited on a 200 mm diameter silicon substrate with a Ti/Au cathode current collector. The device stack was placed in a microwave chamber equipped with up to 8 magnetrons operating at a frequency of 2.45 GHz, under which conditions there is preferential microwave absorption in the $LiCoO_2$ layer. The microwave power and power ramping profile of each magnetron can be adjusted. Different configurations can be used to obtain uniform and efficient annealing, for instance, quartz susceptor plates may be placed on both sides of the substrate of interest to concentrate the heat. The anneal time can be from several minutes to tens of minutes depending on the power and chamber configuration. Raman spectra readings for the microwave annealed $LiCoO_2$ layers demonstrate good crystallization of the $LiCoO_2$ material uniformly over the 200 mm wafer and over a wide process window. Furthermore, process conditions were identified for which there is no appreciable stress cracking of the $LiCoO_2$ layer, as determined using optical microscopy at a magnification of 100 times and with a resolution of approximately 200 nm. Other cathodes and intercalation anodes that may be suitable for microwave processing as described above include: layered cathode materials (e.g., nickel cobalt aluminum oxide (NCA) and nickel cobalt manganese oxides (NCM)), spinel-based oxides (e.g. Lithium Manganese Oxide), and olivine based phosphates such as lithium iron phosphate (LFP) for the cathode; and lithium titanate for the anode.

Note that the microwave annealing chamber may be capable of handling multiple substrates for simultaneous processing. Furthermore substrate sizes up to 300 mm×300 mmm or larger may be accommodated. Larger substrates or multiple-up substrates covering a larger area are also envisaged, although the microwave heating needs to be sufficiently uniform across the entire processing area to enable the process for larger substrates.

A microwave anneal chamber as described above may be used as a stand-alone tool for batch processing of electrochemical devices. Alternatively, the microwave anneal chamber may be engineered to be integrated into a processing system such as a cluster tool platform or in-line platform to allow for efficient processing of devices. Some examples of integrated systems are provided below and illustrated in FIGS. 4-6.

Figure 4:
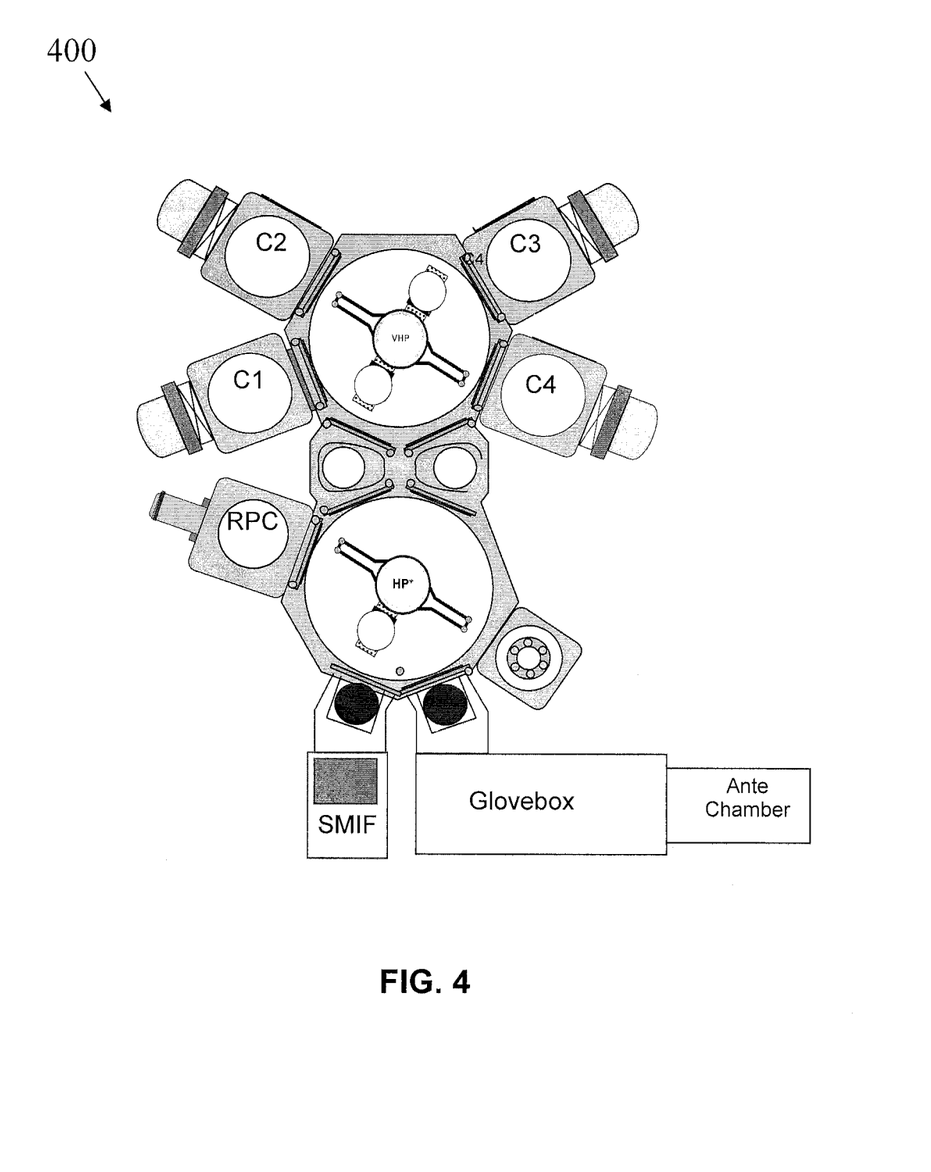
FIG. 4 is a schematic illustration of a thin film deposition cluster tool, according to some embodiments.

FIG. 4 is a schematic illustration of a processing system 400 for fabricating an electrochemical device, such as a TFB or EC device, according to some embodiments. The processing system 400 includes a standard mechanical interface (SMIF) to a cluster tool equipped with a reactive plasma clean (RPC) chamber and process chambers C1-C4, which may be utilized in the process steps described above. A glovebox may also be attached to the cluster tool if needed. The glovebox can store substrates in an inert environment (for example, under a noble gas such as He, Ne or Ar), which is useful after alkali metal/alkaline earth metal deposition. An ante chamber to the glovebox may also be used if needed—the ante chamber is a gas exchange chamber (inert gas to air and vice versa) which allows substrates to be transferred in and out of the glovebox without contaminating the inert environment in the glovebox. (Note that a glovebox can be replaced with a dry room ambient of sufficiently low dew point as such is used by lithium foil manufacturers.) The chambers C1-C4 can be configured for process steps for manufacturing thin film battery devices which may include microwave annealing of a cathode layer according to some embodiments, as described herein. Examples of potentially suitable cluster tool platforms include Applied Material's Endura™, and Centura™ for smaller substrates. It is to be understood that while a cluster arrangement has been shown for the processing system 400, a linear system may be utilized in which the processing chambers are arranged in a line without a transfer chamber so that the substrate continuously moves from one chamber to the next chamber.

Figure 5:
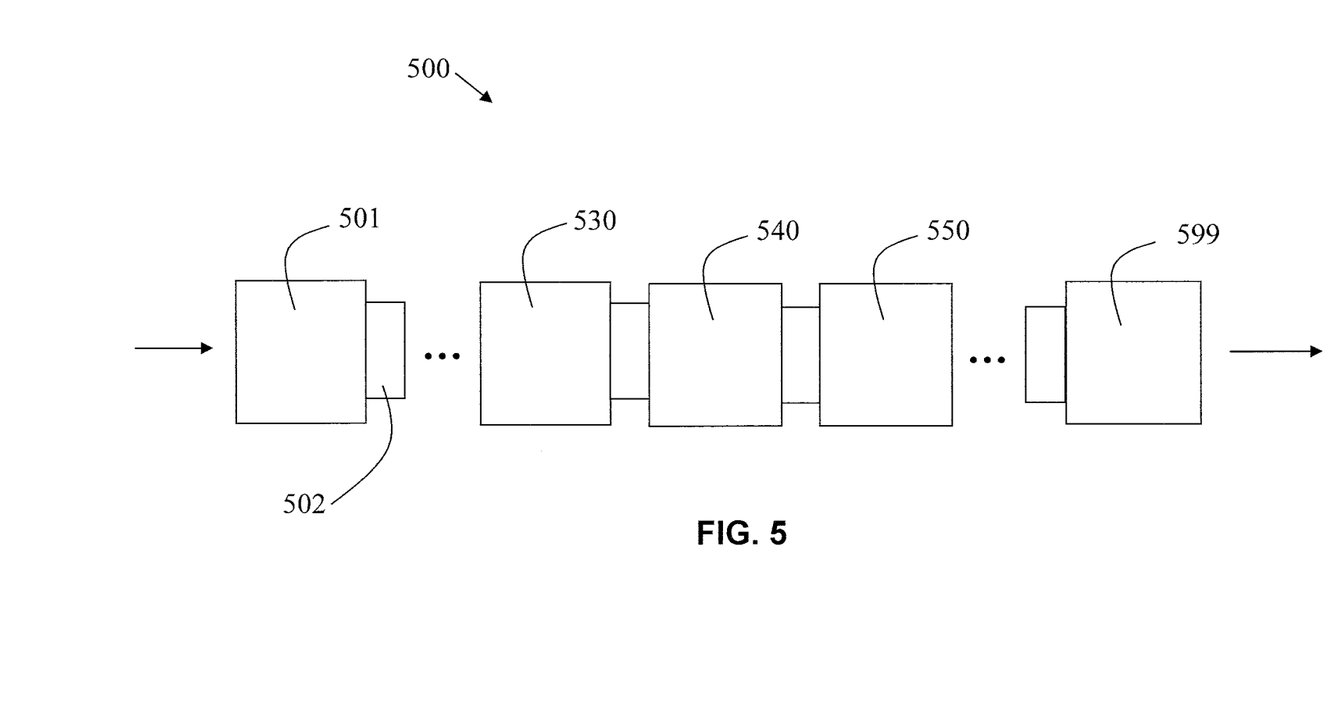
FIG. 5 is a representation of a thin film deposition system with multiple in-line tools, according to some embodiments.

FIG. 5 shows a representation of an in-line fabrication system 500 with multiple in-line tools 501 through 599, including tools 530, 540, 550, according to some embodiments. In-line tools may include tools for depositing all the layers of an electrochemical device—including both TFBs and electrochromic devices. Furthermore, the in-line tools may include pre- and post-conditioning chambers. For example, tool 501 may be a pump down chamber for establishing a vacuum prior to the substrate moving through a vacuum airlock 502 into a deposition tool. Some or all of the in-line tools may be vacuum tools separated by vacuum airlocks. Note that the order of process tools and the specific process tools in the process line will be determined by the particular device fabrication method being used. For example, one of the in-line tools may be dedicated to microwave annealing of a cathode layer according to some embodiments, as described herein. Furthermore, substrates may be moved through the in-line fabrication system oriented either horizontally or vertically.

Figure 6:
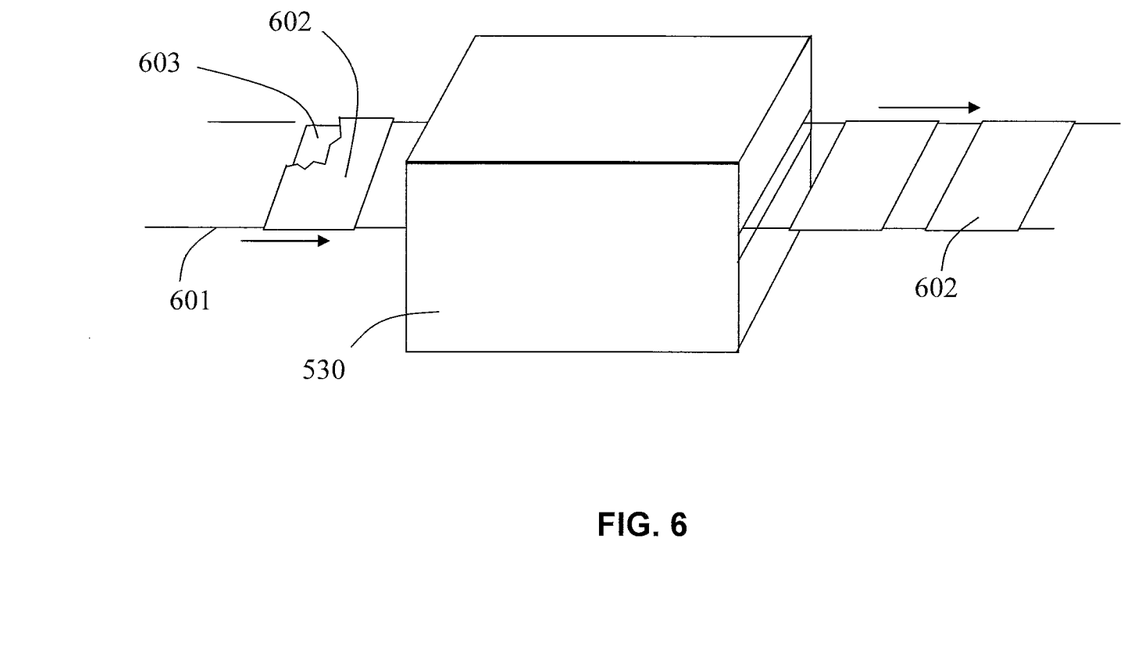
FIG. 6 is a representation of an in-line deposition tool, according to some embodiments.

In order to illustrate the movement of a substrate through an in-line fabrication system such as shown in FIG. 5, in FIG. 6 a substrate conveyer 601 is shown with only one in-line tool 530 in place. A substrate holder 602 containing a substrate 603 (the substrate holder is shown partially cut-away so that the substrate can be seen) is mounted on the conveyer 601, or equivalent device, for moving the holder and substrate through the in-line tool 530, as indicated. A suitable in-line platform for processing tool 530 with vertical substrate configuration may be Applied Material's New Aristo™. A suitable in-line platform for processing tool 530 with horizontal substrate configuration may be Applied Material's Aton™.

In further embodiments, in-situ microwave annealing of a particular device layer may be used, where the microwave annealing is completed in the same chamber as the layer deposition.

Although embodiments of the present disclosure have been described for the particular example of microwave annealing of a $LiCoO_2$ cathode in a TFB device, the process of the present disclosure may also be used for post anneal of indium tin oxide (ITO) to improve the optical transparency and electrical conductivity of ITO device layers. ITO is used as a transparent electrode in electrochemical devices, such as the upper and lower transparent electrodes in EC devices and is typically sputter deposited. See Granqvist, C.-G., Nature Materials, v5, n2, February 2006, p 89-90; C.-G. Granqvist Handbook of Inorganic Electrochromic Materials, Elsevier, 1995; and U.S. Pat. No. 5,995,271 to Zieba et al. A post deposition anneal of the upper TCO layer in an EC device is problematic due to the undesirable effects of heating the entire EC stack—typically the cathode and anode need to be in an amorphous or microcrystalline state for device functionality. However, the microwave annealing may provide the desired ITO anneal without deleterious effects in the rest of the stack.

For example, a method of manufacturing an electrochromic device may comprise: depositing an upper TCO layer on an electrochromic device stack on a substrate, the stack including a lower TCO layer, a cathode, a solid state electrolyte and an anode; and microwave annealing the upper TCO layer to improve the optical transparency and electrical conductivity, wherein the microwave annealing includes selecting annealing conditions with preferential microwave energy absorption in the TCO layer.

Furthermore, the process of the present disclosure may also be used for forming electrode layers, such as nickel oxide-based anode or counter electrode layers, in EC devices. These nickel oxide-based electrode layers are typically comprised of nickel oxide containing composites, where the composite may be single or multiple phase. For example, a method of manufacturing an electrochromic device may comprise: depositing an electrode layer on an electrochromic device stack on a substrate; and microwave annealing the electrode layer to form the electrode, wherein the microwave annealing includes selecting annealing conditions with preferential microwave energy absorption in the electrode layer.

Figure 7:
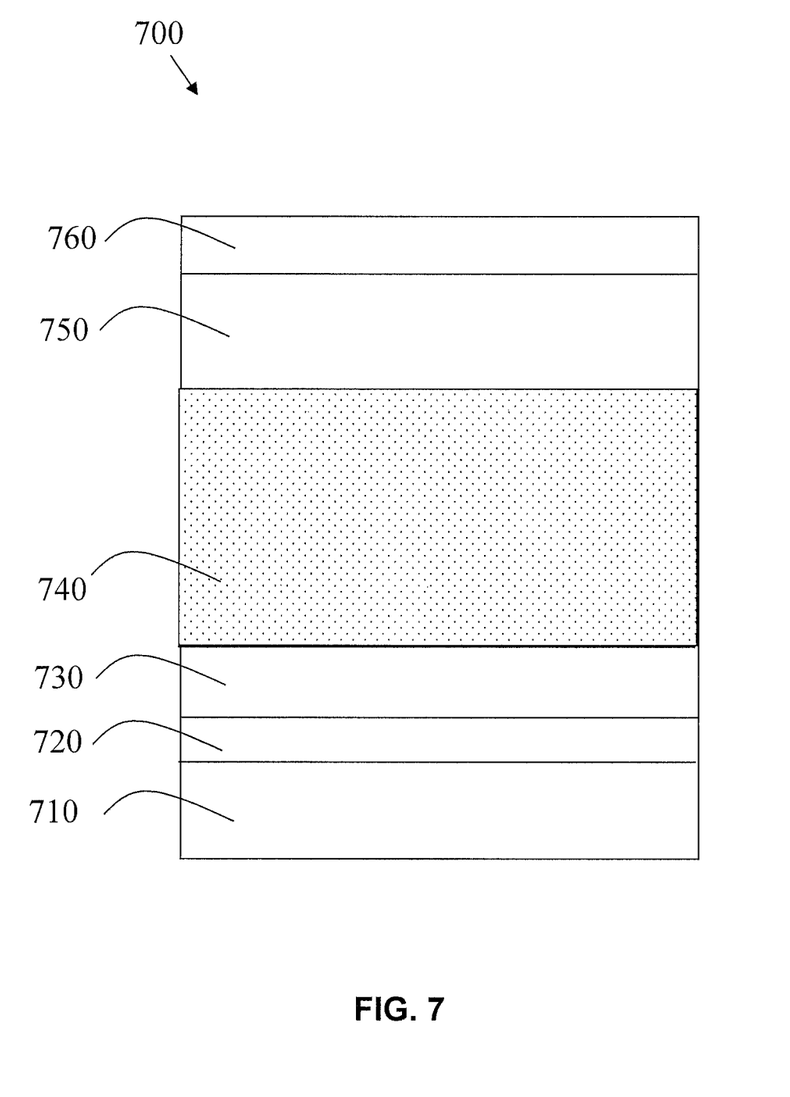
FIG. 7 is a cross-sectional representation of an electrochromic device, according to some embodiments.

A cross-sectional representation of an electrochromic device 700 fabricated according to aspects of the present disclosure, is shown in FIG. 7. The device 700 comprises a glass substrate 710, lower transparent conductive oxide (TCO) layer 720, a cathode 730, a solid electrolyte 740, a counter electrode (anode) 750 and upper TCO layer 760. Alternatively, the stack can be inverted where 730 is the anode/counter electrode and 750, the cathode. For simplicity, a protective coating and electrical contacts to the lower and upper TCO layers are not shown. Furthermore, there may be a diffusion barrier layer (not shown) between the glass substrate 710 and the lower TCO layer 720, to reduce the diffusion of ions from the glass substrate into the TCO layer, and vice versa. Substrate materials may include glass and plastics such as polyimide (PI), polyethylene terephthalate (PET) and polyethylene naphthalate (PEN). As described above, the upper TCO layer may be microwave annealed to improve optical transparency and electrical conductivity. Furthermore, the anode or cathode may undergo formation using microwave annealing.

Although embodiments of the present disclosure have been particularly described with reference certain embodiments thereof, it should be readily apparent to those of ordinary skill in the art that changes and modifications in the form and details may be made without departing from the spirit and scope of the disclosure. It is intended that the appended claims encompass such changes and modifications.

What is claimed is:

1. A method of manufacturing an electrochemical device comprising:
    depositing an electrochemical device stack over a substrate; and
    microwave annealing a layer in said electrochemical device stack, wherein said microwave annealing includes selecting annealing conditions with preferential microwave energy absorption in said layer, said layer reaching an annealing temperature, T, while surrounding layers in said electrochemical device stack experience a temperature less than T, wherein said electrochemical device stack further comprises an interlayer, said interlayer reflecting, said microwave energy to facilitate in said preferential microwave energy absorption in said layer.

2. The method as in claim 1, wherein said electrochemical device is a thin film battery.

3. The method as in claim 1, wherein said electrochemical device is an electrochromic device.

4. The method as in claim 1, wherein said electrochemical device is a thick film battery.

5. The method as in claim 2, wherein said layer is a cathode layer and said microwave annealing crystallizes said cathode layer, and wherein said cathode layer is deposited on a cathode current collector, said cathode current collector being deposited on said substrate.

6. The method as in claim 5, wherein said cathode layer is a $LiCoO_2$ layer.

7. The method as in claim 6, wherein said $LiCoO_2$ layer is deposited by physical vapor deposition.

8. The method as in claim 3, wherein said layer is an upper transparent conductive oxide (TCO) layer and said microwave annealing improves optical transmittance and electrical conductivity of said upper TCO layer, and wherein said upper TCO layer is deposited on an electrochromic device stack including a lower TCO layer, a cathode, a solid state electrolyte and an anode.

9. The method as in claim 8, wherein said upper TCO layer is an indium tin oxide (ITO) layer.

10. The method as in claim 9, wherein said ITO layer is sputter deposited.

11. The method as in claim 3, wherein said layer is an electrode including nickel oxide and said microwave annealing forms said electrode.

12. The method as in claim 11, wherein said electrode is deposited on an electrochromic device stack including a lower TCO layer, a cathode and a solid state electrolyte.

13. The method as in claim 11, wherein said electrode is deposited on a lower TCO layer.

14. The method as in claim 4, wherein said thick film battery is a lithium ion battery, said layer is a lithium ion cathode deposited as a slurry and said microwave annealing dries and forms said cathode.

15. An apparatus for forming an electrochemical device, comprising:
    a first system to deposit an electrochemical device stack over a substrate; and
    a second system to microwave anneal a layer in said electrochemical device stack, wherein said second system is configured to provide preferential microwave energy absorption in said layer, said layer reaching an annealing temperature, T, while surrounding layers in said electrochemical device stack experience a temperature less than T, wherein said electrochemical device stack further comprises a thermoelectric layer, said thermoelectric layer providing a barrier to heat diffusion in said electrochemical device stack during said microwave annealing.

16. The apparatus as in claim 15, wherein said electrochemical device is a thin film battery, said first system is a system configured to deposit a cathode layer on a cathode current collector formed on a substrate, and said second system is configured to crystallize said cathode layer.

17. The apparatus as in claim 15, wherein said electrochemical device is an electrochromic device, said first system is a system configured to deposit an upper transparent conductive oxide (TCO) layer on an electrochromic device stack on said substrate, said stack including a lower TCO layer, a cathode, a solid state electrolyte and an anode and said second system is configured to improve the optical transmittance and electrical conductivity of said upper TCO layer.

18. The apparatus as in claim 15, wherein said electrochemical device is an electrochromic device, said first system is a system configured to deposit a nickel oxide electrode on an electrochromic device stack on said substrate, said stack including a lower TCO layer, an electrode and a solid state electrolyte formed on said substrate and said second system is configured to form said nickel oxide electrode, wherein said nickel oxide electrode is an electrode including nickel oxide.

19. The apparatus as in claim 15, wherein said electrochemical device is an electrochromic device, said first system is a system configured to deposit a nickel oxide electrode on an electrochromic device stack on said substrate, said stack including a lower TCO layer and said second system is configured to form said nickel oxide electrode, wherein said nickel oxide electrode is an electrode including nickel oxide.

20. The apparatus as in claim 15, wherein said electrochemical device is a lithium ion battery, said first system is a system configured to deposit a layer of cathode material as a slurry and said second system is configured to dry and form said cathode material.

21. The apparatus of claim 15, wherein said thermoelectric layer is a $Bi_2Te_3$ layer.

22. The method of claim 2, wherein a thickness of said interlayer is selected depending on a predetermined percentage of incident microwave energy that needs to be reflected by said interlayer.

23. The method of claim 3, wherein said interlayer in a thin layer of metal that is optically transparent.

24. The method of claim 23, wherein the thickness is less than 100 nm.

* * * * *

UNITED STATES PATENT AND TRADEMARK OFFICE
CERTIFICATE OF CORRECTION

PATENT NO. : 9,828,669 B2  
APPLICATION NO. : 14/853551  
DATED : November 28, 2017  
INVENTOR(S) : Song et al.

Page 1 of 1

It is certified that error appears in the above-identified patent and that said Letters Patent is hereby corrected as shown below:

In Column 3, Line 10, delete "performance," and insert -- performance. --, therefor.

In Column 7, Line 8, delete "No," and insert -- No. --, therefor.

In Column 10, Line 20, in Claim 1, delete "reflecting," and insert -- reflecting --, therefor.

Signed and Sealed this  
Twenty-second Day of May, 2018

Andrei Iancu  
*Director of the United States Patent and Trademark Office*